(12) United States Patent
Angenendt et al.

(10) Patent No.: US 10,907,782 B2
(45) Date of Patent: Feb. 2, 2021

(54) LUMINESCENT FIBER, LUMINESCENT FABRIC, AND METHOD FOR PRODUCING A LUMINESCENT FIBER

(71) Applicant: OSRAM GmbH, Munich (DE)

(72) Inventors: Guido Angenendt, Munich (DE); Sridharan Venk, Treviso (IT)

(73) Assignee: OSRAM GmbH, Munich (DE)

( * ) Notice: Subject to any disclaimer, the term of this patent is extended or adjusted under 35 U.S.C. 154(b) by 0 days.

(21) Appl. No.: 16/494,784

(22) PCT Filed: Mar. 12, 2018

(86) PCT No.: PCT/EP2018/056077
§ 371 (c)(1),
(2) Date: Sep. 17, 2019

(87) PCT Pub. No.: WO2018/166966
PCT Pub. Date: Sep. 20, 2018

(65) Prior Publication Data
US 2020/0278093 A1   Sep. 3, 2020

(30) Foreign Application Priority Data

Mar. 17, 2017  (DE) .................. 10 2017 105 784

(51) Int. Cl.
*F21S 4/24* (2016.01)
*H05K 1/02* (2006.01)
(Continued)

(52) U.S. Cl.
CPC .............. *F21S 4/24* (2016.01); *D03D 1/0082* (2013.01); *D03D 1/0088* (2013.01);
(Continued)

(58) Field of Classification Search
CPC ......... F21S 4/24; H05K 1/0281; H05K 1/189; H05K 1/147; H05K 3/303; D03D 1/0082; D03D 1/0088
See application file for complete search history.

(56) References Cited

U.S. PATENT DOCUMENTS

2004/0009729 A1   1/2004  Hill et al.
2010/0252307 A1   10/2010 Mo
(Continued)

FOREIGN PATENT DOCUMENTS

DE      10124457 A1    11/2002
DE   102004050838 A1    4/2006
(Continued)

OTHER PUBLICATIONS

International Search Report based on Application PCT/EP2018/056077 (5 pages) dated Jun. 8, 2018 (for reference purpose only).
(Continued)

*Primary Examiner* — Thomas M Sember
(74) *Attorney, Agent, or Firm* — Viering, Jentschura & Partner MBB

(57) ABSTRACT

A luminous fiber may include a flexible printed circuit board extending in a length direction of the fiber, at least one electrically conductive trace being formed on the flexible printed circuit board, at least one light emitting component being arranged on the flexible printed circuit board and being electrically connected to the trace, and a lateral strengthening structure for strengthening the luminous fiber in lateral direction perpendicular to the length direction. The lateral strengthening structure may include two frame bars, which are formed on the flexible printed circuit board and which extend in the length direction of the fiber. The lateral strengthening structure may include several lateral support elements, which are formed on the flexible printed circuit
(Continued)

board between the frame bars and which are coupled to the frame bars.

15 Claims, 4 Drawing Sheets

(51) Int. Cl.
*H05K 1/18* (2006.01)
*H05K 1/14* (2006.01)
*H05K 3/30* (2006.01)
*D03D 1/00* (2006.01)
*F21Y 105/16* (2016.01)
*F21Y 103/10* (2016.01)
*F21Y 115/10* (2016.01)

(52) U.S. Cl.
CPC ........... *H05K 1/0281* (2013.01); *H05K 1/147* (2013.01); *H05K 1/189* (2013.01); *H05K 3/303* (2013.01); *D03D 2700/0174* (2013.01); *D10B 2401/18* (2013.01); *F21Y 2103/10* (2016.08); *F21Y 2105/16* (2016.08); *F21Y 2115/10* (2016.08); *H05K 2201/10106* (2013.01); *H05K 2201/2009* (2013.01)

(56) References Cited

U.S. PATENT DOCUMENTS

| | | |
|---|---|---|
| 2011/0134161 A1 | 6/2011 | Son et al. |
| 2015/0159812 A1 | 6/2015 | Speer et al. |
| 2016/0320037 A1* | 11/2016 | Wong .................... H05K 1/038 |

FOREIGN PATENT DOCUMENTS

| | | |
|---|---|---|
| DE | 102015204782 A1 | 9/2016 |
| DE | 102015204784 A1 | 9/2016 |

OTHER PUBLICATIONS

German Search Report based on Application 10 2017 105 784.6 (7 pages) dated Feb. 16, 2018 (for reference purpose only).

* cited by examiner

LUMINESCENT FIBER, LUMINESCENT FABRIC, AND METHOD FOR PRODUCING A LUMINESCENT FIBER

CROSS-REFERENCE TO RELATED APPLICATIONS

The present application is a national stage entry according to 35 U.S.C. § 371 of PCT application No.: PCT/EP2018/056077 filed on Mar. 12, 2018; which claims priority to German Patent Application Serial No.: 10 2017 105 784.6, which was filed on Mar. 17, 2017; both of which are incorporated herein by reference in their entirety and for all purposes.

TECHNICAL FIELD

The present invention relates to a luminescent fiber, a luminous fabric, and a method for producing a luminous fiber.

BACKGROUND

Nowadays, more and more luminous textiles come on the market. The luminous textiles may be used for clothes or seat covers for car seats. These luminous textiles can be made of luminous fabrics. One way to produce a luminous textile is to create an LED-strand at first. The LED-strand consists in principle of a flexible printed circuit board (FPCB) with LEDs attached to it. The LED-strand can be woven into the fabric, either in warp or weft direction. The LED-strand may be fixed to the fabric by yarn. The flexible PCB may consist of one or more base layers, one or more conductor layers, and one or more cover layers. A typical width in lateral direction of such an LED-strand is between 0.5 and 5 mm.

During weaving the LED-strand into the fabric, lateral forces can be exerted onto the LED-strand, for example by the fabric yarn. The flexible PCB can be laterally pressed and deformed by these forces. This may result in damaging the electrical connections to the LEDs and contacts with the LEDs on the PCB. This may lead to a malfunction of the LED-strand, such as some or all of the LEDs. Additionally, during wearing the illuminated textile, further forces may be applied on the LED-strand, which may also damage the LED-strand.

SUMMARY

It is desirable to provide the luminous fiber, which is very stable against external forces, which has a high flexibility, and/or which can be produced in a fast, easy and/or cheap way.

It is desirable to provide the luminous fabric, which is very stable against external forces, which has a high flexibility, and/or which can be produced in a fast, easy and/or cheap way.

It is desirable to provide a method for producing a luminous fiber, which contributes to that the luminous fiber is very stable against external forces and has high flexibility, and/or which can carried out in a fast, easy and/or cheap way.

A luminous fiber may be or include a flexible printed circuit board extending in a length direction of the fiber; at least one electrically conductive trace being formed on the flexible printed circuit board; at least one light emitting component being arranged on the flexible printed circuit board and being electrically connected to the trace; and a lateral strengthening structure for strengthening the luminous fiber in lateral direction perpendicular to the length direction, wherein the lateral strengthening structure comprises two frame bars, which are formed on the flexible printed circuit board and which extend in the length direction of the fiber, and wherein the lateral strengthening structure comprises several lateral support elements, which are formed on the flexible printed circuit board between the frame bars and which are coupled to the frame bars.

The lateral strengthening structure may be included into a conventional layer or may form a new layer of the flexible printed circuit board (FPCB). The frame bars extending in the length direction of the FPCB receive external lateral forces. The strengthening elements extending in the lateral direction of the FPCB absorb the external lateral forces. For example, the energy, which is the source of the external lateral forces, can be absorbed by a deformation of the strengthening elements, so that the energy is converted into deformation energy and heat. Between the frame bars and the lateral support elements sufficient space may be provided in order to not to decrease the flexibility of the FPCB too much and to assure the high flexibility of the luminous fiber. Therefore, the lateral strengthening structure strengthens the FPCB while keeping its flexibility. Further, the luminous fiber having the lateral strengthening structure can be produced in a fast, easy and cheap way.

The frame bars can be formed continuously over the whole length of the FPCB to catch all external lateral forces along the whole length of the FPCB. The frame bars can be formed in parallel to the trace and, if any, to one or more further traces.

According to an embodiment, one of the frame bars is formed along a lateral outer edge of the flexible printed circuit board and the other frame bar is formed along another lateral outer edge of the flexible printed circuit board. Each of the frame bars can be situated directly at the corresponding edge of the FPCB. In this case, the distance between the frame bars and the corresponding edges is zero. Alternatively, each frame bar has a given positive distance to the corresponding edge. The given positive distance may correspond to less than 30% of the width of the FPCB, for example less than 20% of the width of the FPCB, for example less than 10% of the width of the FPCB.

According to an embodiment, each lateral support element extends from one of the frame bars to the other frame bar. This contributes to a very efficient conversion of the external energy into deformation energy. There may be arranged multiple lateral support elements and each lateral support element contributes to absorb the energy and therefore to strengthening the FPCB.

According to an embodiment, the frame bars and the lateral support elements are formed of one piece. This contributes to a very efficient conversion of the external energy into deformation energy. Further, this enables to produce the frame bars and the lateral support elements at one time. This may contribute to produce the luminous fiber quickly and/or easily.

According to an embodiment, the lateral support elements comprise perpendicular struts, which are perpendicular to the frame bars, inclined struts, which are inclined to the frame bars, hexagons, triangles, and/or spring-elements, which have an S-form or a multiple S-form, for example a double-S-form. These forms enable to very efficiently absorb external lateral forces and the corresponding external energy and therefore to strengthening the luminous fiber in lateral direction.

According to an embodiment, the lateral strengthening structure is at least in part electrically isolated by an electrically isolating material. If the frame bars and/or the lateral support elements are made of an electrically conductive material and if the corresponding frame bar and, respectively, the corresponding lateral support elements cross the trace for supplying energy to the light emitting elements, the trace is electrically isolated from the frame bars and, respectively, the lateral support elements by the isolating material. As such, no short can be caused by the lateral strengthening structure. In non-limiting embodiments, the lateral strengthening structure may be covered by the isolating material and the trace may be formed on the isolating material. Alternatively, the trace may be covered by the isolating material and the lateral strengthening structure may be formed on the isolating material. There may be no isolating material over the lateral strengthening structure and/or the trace at positions, where the lateral strengthening structure and the traces do not cross each other.

Alternatively or additionally, the lateral strengthening structure can be made of the electrically isolating material.

According to an embodiment, the lateral strengthening structure is completely electrically isolated by the electrically isolating material.

According to an embodiment, the lateral strengthening structure and the flexible printed circuit board are completely covered by the electrically isolating material. In non-limiting embodiments, the isolating material may be formed as a closed layer all over or all under the lateral strengthening structure depending on whether the trace is formed above or, respectively, below the lateral strengthening structure.

According to an embodiment, the trace and the light emitting elements are arranged on a first side of the flexible printed circuit board and the lateral strengthening structure is arranged on a second side of the flexible printed circuit board, with the second side facing away from the first side. The traces for providing energy to the LEDs are formed either beneath or above the lateral strengthening structure.

According to an embodiment, at least two separate electrically conductive traces are formed on the flexible printed circuit board and the light emitting element is electrically connected to both traces.

According to an embodiment, the lateral strengthening structure has or is made of a metal, a polymer, and/or a reinforced polymer. For example, the frame bars may be made of copper or aluminum. Alternatively or additionally, the frame bars may be made of one or more polymers, for example carbon-fiber or carbon-particles reinforced polymers. The lateral support elements may be made of a metal or plastic. For example, the lateral support elements may be made of copper or aluminum. Alternatively or additionally, the lateral support elements may be made of one or more polymers, for example carbon-fiber or carbon-particles reinforced polymers. If the lateral strengthening structure is included into or in direct contact to a conductor layer, the lateral strengthening structure be made of electrically isolating material, for example plastic. If the lateral strengthening structure is made of an electrically conductive material, for example metal, a non-conducting, electrically isolating layer may be introduced between the lateral strengthening structure and the trace or, respectively, traces.

According to an embodiment, the luminous fiber has a mantle, in which the flexible printed circuit board, the traces, the light emitting elements, and the lateral strengthening structure are embedded, wherein the mantle is at least in part transparent for the light emitted by the light emitting element. Optionally, the mantle may contain luminescent particles that exhibit luminescence when irradiate with either natural or artificial light. An outer surface of the mantle may be such smooth that the luminous fiber may be woven into a fabric, e.g. by a conventional weaving method. Alternatively, only the flexible printed circuit board may be covered by a transparent material and the backside may be uncovered. The transparent material may for example embeds the traces, the light emitting elements, and/or the lateral strengthening structure. The transparent material may have a smooth outer surface, be such that the luminous fiber may be woven into a fabric, e.g. by a conventional weaving method.

It is desirable to have a luminous fabric having or being made of multiple luminous fibers as explained above. The luminous fabric may be formed by a base fabric, which is formed by non-luminous fibers and in which the luminous fibers are inserted. Alternatively, the luminous fabric may be formed by weaving the base fabric by non-luminous fibers and the luminous fibers at the same time. In both cases, the luminous fibers may be additionally fixed to the fabric by yarn, which may exerts an external lateral force on the luminous fiber. Alternatively, the luminous fabric may be formed by weaving luminous fibers and non-luminous fibers. Alternatively, the luminous fabric may be formed by weaving luminous fibers only.

The advantages and embodiments explained above with respect to the luminous fibers can simply be transferred to advantages and embodiments of the luminous fabric. Therefore, a repetition of the explanation of these advantages and embodiments is omitted.

According to an embodiment, the luminous fabric is woven by the luminous fibers, wherein the luminous fibers are woven in warp and/or weft direction.

It is desirable to have a method for producing a luminous fiber where the method may include providing a flexible printed circuit board extending in a length direction of the fiber; forming at least one electrically conductive trace on the flexible printed circuit board; arranging at least one light emitting component on the flexible printed circuit board and electrically connecting the light emitting component to the trace; and forming a lateral strengthening structure for strengthening the luminous fiber in lateral direction perpendicular to the length direction by forming two frame bars, which extend in the length direction of the fiber, on the flexible printed circuit board, and by forming several lateral support elements on the flexible printed circuit board between the frame bars such that they are coupled to the frame bars.

The advantages and embodiments explained above with respect to the luminous fibers and the luminous fabric can simply be transferred to advantages and embodiments of the method for producing the luminous fiber. Therefore, a repetition of the explanation of these advantages and embodiments is omitted.

The lateral strengthening structure, e.g. the frame bars and the lateral support elements, may be produced by using existing production processes like plating, printing, 3D-printing, or laminating. The lateral strengthening structure may be formed before forming the traces and/or before arranging the light emitting elements. Alternatively, the lateral strengthening structure may be formed after forming the traces and/or after arranging the light emitting elements.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DETAILED DESCRIPTION

The following detailed description refers to the accompanying drawings that show, by way of illustration, specific details and embodiments that may be practiced. The word "exemplary" is used herein to mean "serving as an example, instance, or illustration". Any embodiment or design described herein as "exemplary" is not necessarily to be construed as preferred or advantageous over other embodiments or designs. The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Figure 1:
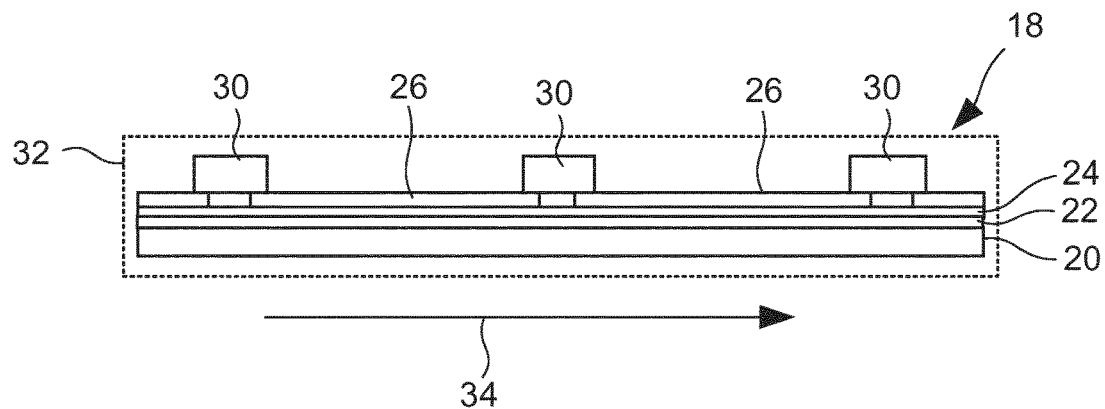
FIG. 1 shows a cross-sectional side view of an exemplary embodiment of a luminous fiber.

FIG. 1 shows a cross-sectional side view of an exemplary embodiment of a luminous fiber 18.

Figure 2:
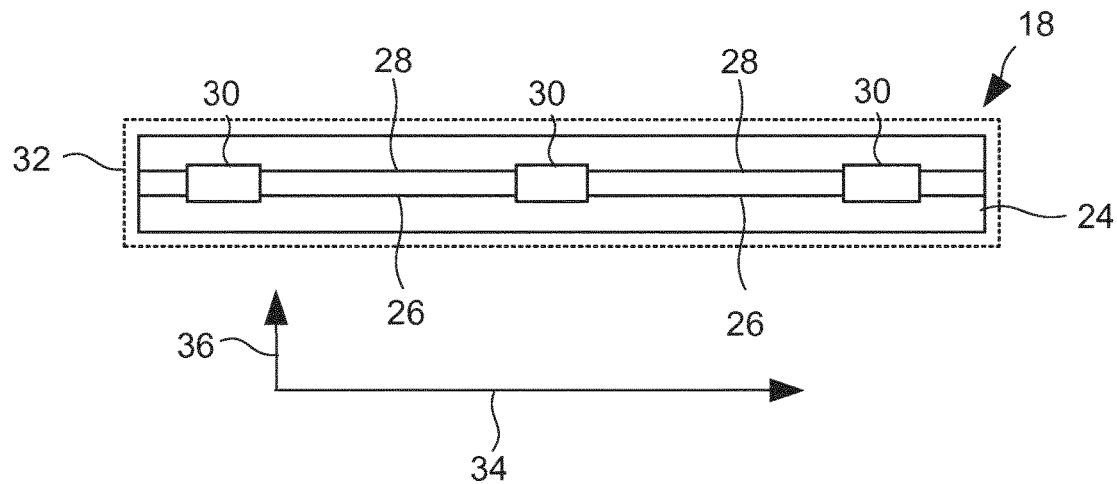
FIG. 2 shows the top view of the luminous fiber according to FIG. 1.

FIG. 2 shows the top view of the luminous fiber 18 according to FIG. 1.

The luminous fiber 18 has a flexible printed circuit board (FPCB) 20, a lateral strengthening structure 22, a layer of isolating material 24, an electrically conductive first trace 26, an electrically conductive second trace 28, several light emitting elements 30, and optionally a mantle 32. The FPCB 20 and the traces 26, 28 extend in a length direction 34 of the luminous fiber 18. A lateral direction 36 is perpendicular to the length direction 34. The widths of the luminous fiber 18 and the FPCP 20 extend in the lateral direction 36.

The FPCB 20 has a first side and second side facing away from the first side. With respect to FIG. 1, an upper surface of the FPCB 20 is located on the first side and a bottom surface of the FPCB 20 is located on the second side. The FPCB 20 may have a plastic-foil and/or a metal-foil. For example, the FPCB 20 may have several plastic-foils and/or metal-foils stacked and/or laminated above one each other. Such a plastic-foil may be made of Kapton, Polyimide (PI), Polyethylene (PE), Polypropylene (PP), Polyvinyl chloride (PVC), Polystyrole (PS), Polyester, Polycarbonate (PC), Polyethylenterephthalate (PET), Polyethersulfone (PES), PEEK, PTFE, and/or Polyethylennaphthalate (PEN). A corresponding metal-foil may be made of steel and/or copper. The width of the FPCB 20 may be in a range of 0.1 mm to 10 mm, for example 1.5 mm to 5 mm, for example 1 mm to 3 mm.

The lateral strengthening structure 22 is formed on the FPCB 20. The lateral strengthening structure 22 may be formed directly on the FPCB 20. Alternatively, an additional layer, for example on isolating layer may be arranged between the lateral strengthening structure 22 and the FPCB 20. The lateral strengthening structure 22 can be made of metal, for example copper and/or aluminum, and/or plastic, for example one or more polymers, and/or one or more polymers reinforced by fibers, for example carbon-fibers, and/or particles, for example carbon particles. The structure of the lateral strengthening structure 22 is explained in more detail below with respect to FIGS. 4 to 8.

The layer of isolating material 24 is formed on the lateral strengthening structure 22. The layer of isolating material 24 completely covers the lateral strengthening structure 22 and the upper surface of the FPCB 20. In general, the layer of isolating material 24 is meant for electrically isolating the lateral strengthening structure 22 against the traces 26, 28, such that the lateral strengthening structure 22 cannot cause a short between the traces 26, 28. However, if the lateral strengthening structure 22 is made of an electrically non-conductive material, the layer of isolating material 24 may be omitted. If the lateral strengthening structure 22 is made of an electrically conductive material, the layer of isolating material 24 at least covers those parts of the lateral strengthening structure 22 which, in a projection of the traces 26, 28 on the lateral strengthening structure 22, cross the traces 26, 28. Therefore, in an alternative embodiment, the isolating material 24 may not be formed as a layer completely covering the lateral strengthening structure 22 and the upper surface of the FPCB 20, but as a structured layer covering the lateral strengthening structure 22 only or covering parts of the lateral strengthening structure 22 only such that no short can be caused between the traces 26, 28 by the lateral strengthening structure 22.

The traces 26, 28 are formed over the upper surface of the FPCB 20. In non-limiting embodiments, such as those shown in FIGS. 1 and 2, the traces 26, 28 are formed over the lateral strengthening structure 22 on the layer of isolating material 24. In an alternative embodiment, in which the layer of isolating material 24 is omitted, the traces 26, 28 may be formed directly on the lateral strengthening structure 22 and/or directly on the FPCB 20. In another alternative embodiment, the traces 26, 28 may be formed between the FPCB 20 and the lateral strengthening structure 24 and, in case, the layer of isolating material 24. In another alternative embodiment, the traces 26, 28 are integrated in the FPCB 20. In the latter two cases, the electrical connection to the light emitting elements 30 may be fed through the lateral strengthening structure 22 and/or the isolating layer 24, if any. The traces 26, 28 extend in the length direction 34. The traces 26, 28 are arranged in parallel to each other. The traces 26, 28 are arranged for electrically connecting the light emitting elements 30 in parallel. In an alternative embodiment, there may be only one trace 26 for electrically connecting the light emitting elements 30 in series. In a further alternative embodiment, there may be more than two traces, which may be used to form several groups of light emitting elements 30, wherein within the groups the light emitting elements 30 may be electrically arranged in parallel or in series and wherein the groups of light emitting elements 30 may be electrically arranged in a series or, respectively, in parallel. The traces 26, 28 may be connected to a driver for driving the light emitting elements 30.

The light emitting elements 30 are arranged over the FPCB 20, the lateral strengthening structure 22 and the layer of isolating material 24 and are electrically connected to the traces 26, 28. The light emitting elements 30 are electrically connected in parallel. Alternatively, the light emitting elements 30 are electrically connected in series. Alternatively, some of the light emitting elements 30 are electrically connected in series and some are electrically connected in parallel. The light emitting elements 30 are LEDs. Alternatively, the light emitting elements 30 are OLEDs. Alternatively, some of the light emitting elements 30 are LEDs and some are OLEDs. The light emitting elements 30 are top-emitters, which are arranged such that they emit light in the direction away from the FPCB 20. Alternatively, the light emitting elements 30 are volume-emitters, which emit light in all directions. In this case, there may be formed a reflective layer underneath the light emitting elements 30 for reflecting the light emitted towards the FPCB 20 away from the FPCB 20. Alternatively, the light emitting elements 30 are side emitters, which are arranged such that they emit light in the lateral direction 36 and/or in the opposite direction. Alternatively, some of the light emitting elements 30 are top-emitters, some are volume-emitters, and/or some are side emitters.

Optionally, the mantle 32 is provided. In this case, the FPCB 20, the lateral strengthening structure 22, the layer of isolating material 24, the traces 26, 28 and the light emitting elements 30 are embedded in the mantle 32. Alternatively, only the FPCB 20 may be covered by the mantle 32 and the backside of the FPCB 20 may be uncovered. In the latter case, only the lateral strengthening structure 22, the layer of isolating material 24, the traces 26, 28 and/or the light emitting elements 30 may embedded in the mantle 32. The mantle 32 is at least in part transparent for the light emitted by the light emitting elements 30. For example, the mantle 32 is made of a material transparent or translucent for the light emitted by the light emitting elements 30. Optionally, the mantle may contain luminescent particles that exhibit luminescence when irradiate with either natural or artificial light. In non-limiting embodiments, the material of the mantle 32 has the same or a higher flexibility as the flexible printed circuit board 20. The mantle 32 may be made of silicone and/or PU (polyurethane)-foam. The mantle 32 may have a smooth outer surface. This enables to use the luminous fiber 18 in the same way as a normal non-luminous fiber, e.g. when forming a luminous fabric with the help of the luminous fiber 18, for example when the luminous fiber 18 is woven into the fabric, e.g. by a conventional weaving method. In this case, it is especially advantageous, if the mantle 32 has a cylindrical shape with a smooth outer surface. The outer surface of the mantle 32 may be roughened in order to enhance an outcoupling of the light emitted by the light emitting elements 30.

A width, height, and/or diameter of the luminous fiber 18 may be in a range of 0.1 mm to 10 mm, for example 1.5 mm to 5 mm, for example 1 mm to 3 mm.

Figure 3:
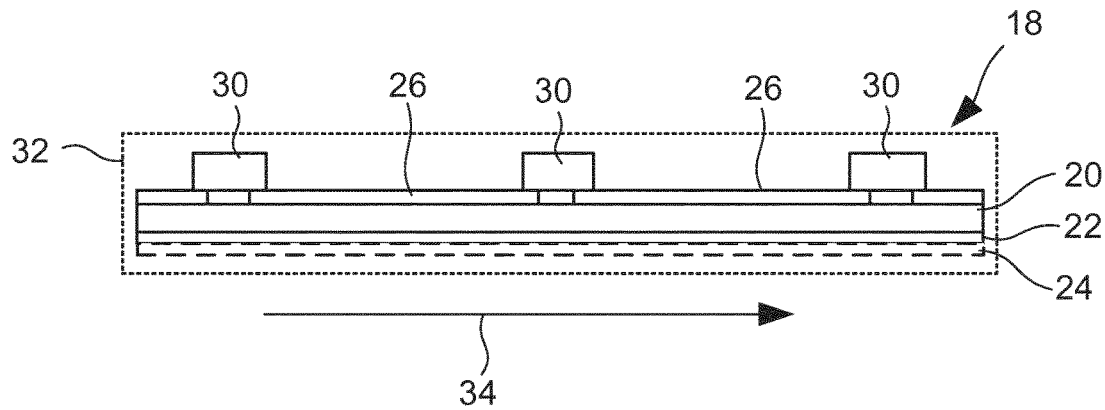
FIG. 3 shows a cross-sectional side view of an exemplary embodiment of a luminous fiber.

FIG. 3 shows a cross-sectional side view of an exemplary embodiment of a luminous fiber 18. The luminous fiber 18 may basically correspond to the luminous fiber 18 explained above. The lateral strengthening structure 22 is formed on the second side of the FPCB 20. Optionally, the layer of isolating material 24 is arranged such that it covers the lateral strengthening structure 22. In the latter case, the layer of isolating material 24 may not be arranged for electrically isolating the lateral strengthening structure 22 against the traces 26, 28, because the traces 26, 28 may be electrically isolated against the lateral strengthening structure 22 by the FPCB 20, but for electrically isolating the lateral strengthening structure 22 against an outside of the luminous fiber 18 and/or for mechanically protecting the lateral strengthening structure 22. The traces 26, 28 are directly formed on the FPCB 22. In an alternative embodiment, the traces 26, 28 may be integrated into the FPCB 20.

The top view of the luminous fiber 18 shown in FIG. 3 may correspond to the top view shown in FIG. 2, wherein from such a top view the upper surface of the FPCB 20 would be visible and not the layer of isolating material 24.

Figure 4:
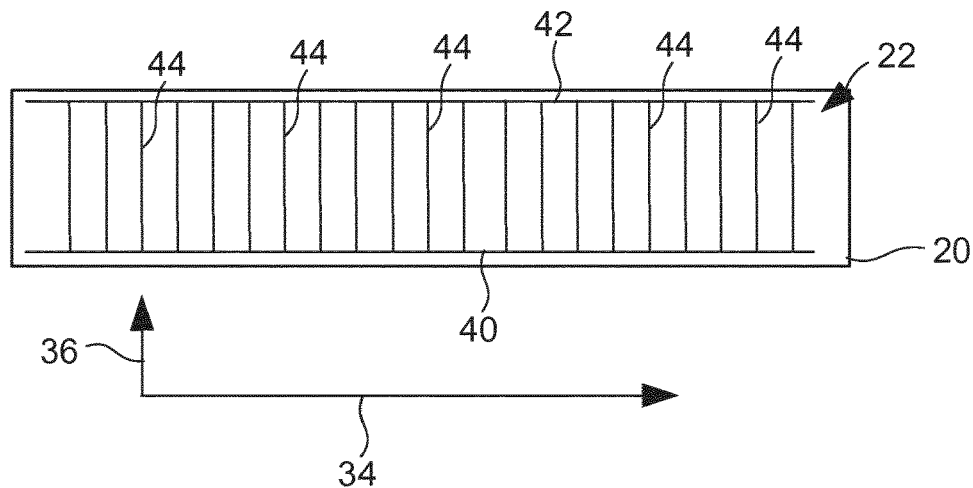
FIG. 4 shows a top view of an exemplary embodiment of a lateral strengthening structure.

FIG. 4 shows a top view of an exemplary embodiment of a lateral strengthening structure 22, for example the lateral strengthening structure 22 as explained with respect to FIGS. 1, 2, and/or 3. The lateral strengthening structure 22 comprises at least a first frame bar 40, a second frame bar 42, and several lateral support elements 44. The frame bars 40, 42 and the lateral support elements 44 are formed on the FPCB 20, for example on the upper surface of the FPCB 20, as explained with respect to FIGS. 1 and 2, or on the bottom surface of the FPCB 20, as explained with respect to FIG. 3.

The frame bars 40, 42 are arranged close to opposing edges of the FPCB 20. The frame bars 40, 42 may have a given positive distance to the corresponding edge in lateral direction 36. The given positive distance may correspond to less than 30% of the width of the FPCB, for example less than 20% of the width of the FPCB, for example less than 10% of the width of the FPCB. In an alternative embodiment, the frame bars 40, 42 may be arranged directly at the opposing edges of the FPCB. In this case, the distance between the frame bars 40, 42 and the corresponding edges is zero. The frame bars 40, 42 extend in the length direction 34. The frame bars 40, 42 are formed continuously, for example in order to very effectively receive the external lateral forces. In an alternative embodiment, the frame bars 40, 42 may have one or more interruptions, for example in order to increase the flexibility of the lateral strengthening structure 22. Each frame bar 40, 42 may have a width in a range of 0.05 mm to 2 mm, for example 0.1 mm to 1.5 mm. The frame bars 40, 42 may be made of one or more of the materials explained above with respect to the lateral strengthening structure 22.

The lateral support elements 44 are arranged between the frame bars 40, 42 on the same side of the FPCB 20 as the frame bars 40, 42. The lateral support elements 44 extend from one of the frame bars 40, 42, to the other of the frame bars 40, 42. The lateral support elements 44 are formed as straight and/or non-interrupted lines. In other words, the lateral support elements 44 are formed as struts. The lateral support elements 44 are formed perpendicular to the frame bars 40, 42. In other words, the lateral support elements 44 extend in the lateral direction 36. In further other words, the lateral support elements 44 are formed of perpendicular struts. The lateral support elements 44 may be made of one or more of the materials explained above with respect to the lateral strengthening structure 22. The lateral support elements 44 and the frame bars 40, 42 may be made of the same material. The lateral support elements 44 and the frame bars 40, 42 may be made of one piece. In an alternative embodiment, the lateral support elements 44 may be made of another material as the frame bars 40, 42, and/or may be made separate from the frame bars 40, 42 and may be connected to the frame bars 40, 42.

If external lateral forces are applied on the luminous fiber 18, these external lateral forces are received by at least one of the frame bars 40, 42. The corresponding frame bar 40, 42 transfers and distributes the corresponding energy to several of the lateral support elements of 44. If the lateral forces and the corresponding energy are relatively small, the frame bars 40, 42 and the lateral support elements 44 are stiff enough to withstand the lateral forces and in this way to strengthen the FPCB 20. If the lateral forces and the corresponding energy are relatively high, the lateral support elements 44 may be deformed. The deformation of the lateral support elements 44 consumes energy and creates heat. So, the received energy is absorbed and converted into deformation energy and heat by the lateral strengthening structure 22, which in this way strengthens the luminous fiber 18.

The lateral strengthening structure 22, e.g. the frame bars 40, 42 and the lateral support elements 44, may be produced by using conventional production processes like plating, printing, 3D-printing, or laminating.

Figure 5:
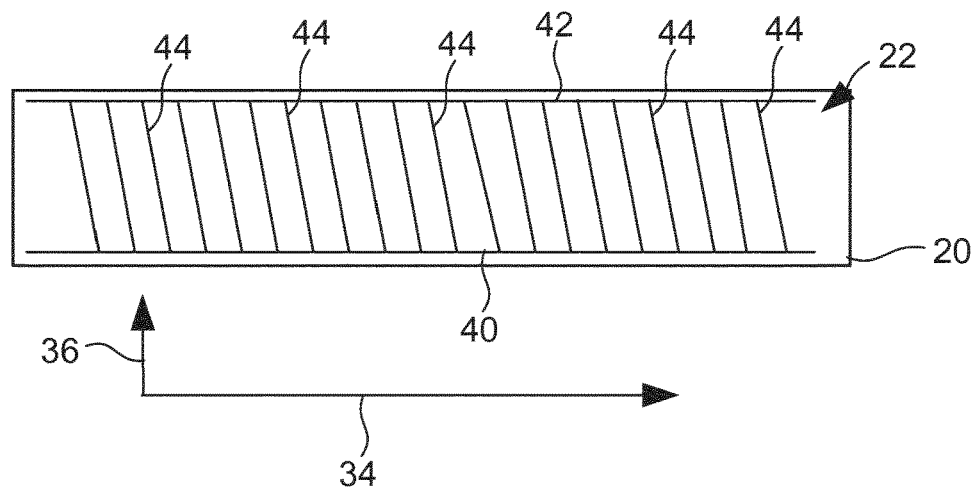
FIG. 5 shows a top view of an exemplary embodiment of a lateral strengthening structure.

FIG. 5 shows a top view of an exemplary embodiment of a lateral strengthening structure 22. The lateral strengthening structure 22 may a widely correspond to the lateral strengthening structure 22 as explained above. The lateral support elements 44 are inclined and not perpendicular with respect to the frame bars 40, 42. In other words, the lateral support elements 44 are formed of inclined struts.

Figure 6:
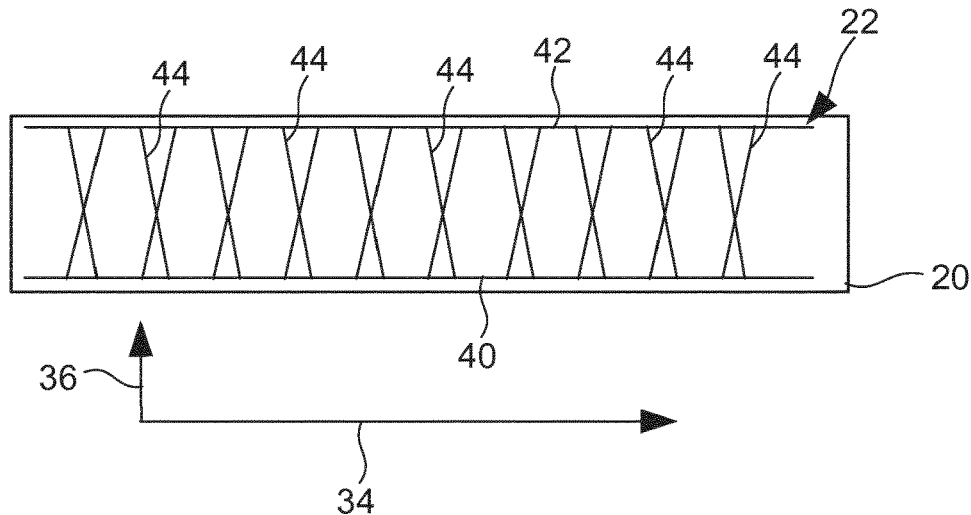
FIG. 6 shows a top view of an exemplary embodiment of a lateral strengthening structure.

FIG. 6 shows a top view of an exemplary embodiment of a lateral strengthening structure 22. The lateral strengthening structure 22 may a widely correspond to the lateral strengthening structure 22 as explained above. The lateral support elements 44 are inclined such the lateral support elements 44 of a pair of neighboring lateral support elements 44 cross each other. In other words, each pair of neighboring lateral support elements 44 forms two triangles, with the tips of the triangles facing and touching each other.

In an alternative embodiment, the lateral support elements 44 may be arranged and inclined such that each pair of neighboring lateral support elements 44 forms only one triangle, wherein the base of such a triangle is formed by one of the frame bars 40, 42 and wherein the tip of such a triangle is connected to and touches the other frame bar 40, 42.

Figure 7:
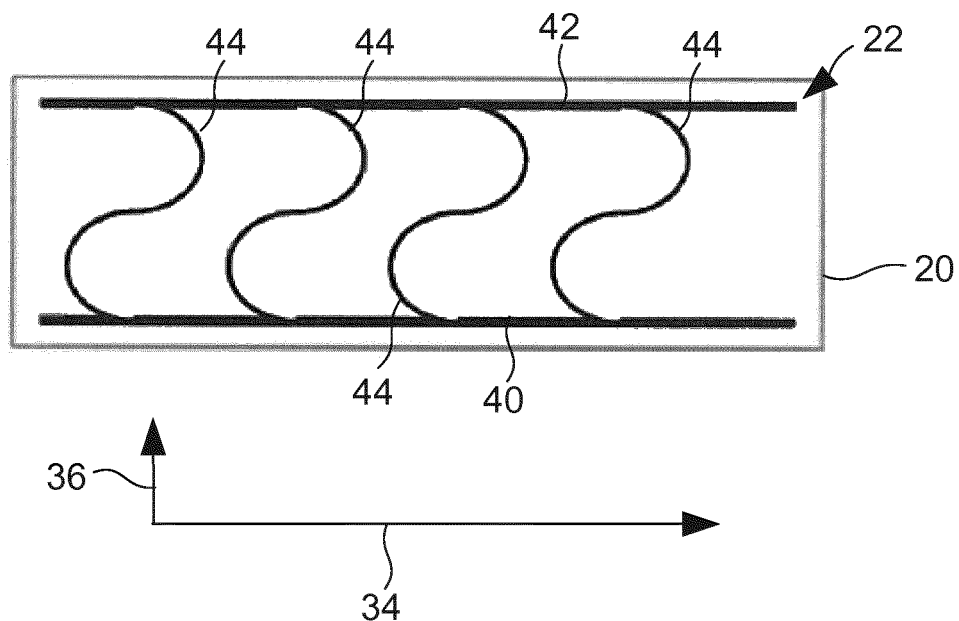
FIG. 7 shows a top view of an exemplary embodiment of a lateral strengthening structure.

FIG. 7 shows a top view of an exemplary embodiment of a lateral strengthening structure 22. The lateral strengthening structure 22 may a widely correspond to the lateral strengthening structure 22 as explained above. The lateral support elements 44 are formed as spring-elements. In other words, the lateral support elements 44 have S-shapes. In an alternative embodiment, in which the lateral support elements 44 are formed as spring-elements, the lateral support elements 44 have multiple-S-shapes, for example double-S-shapes.

Figure 8:
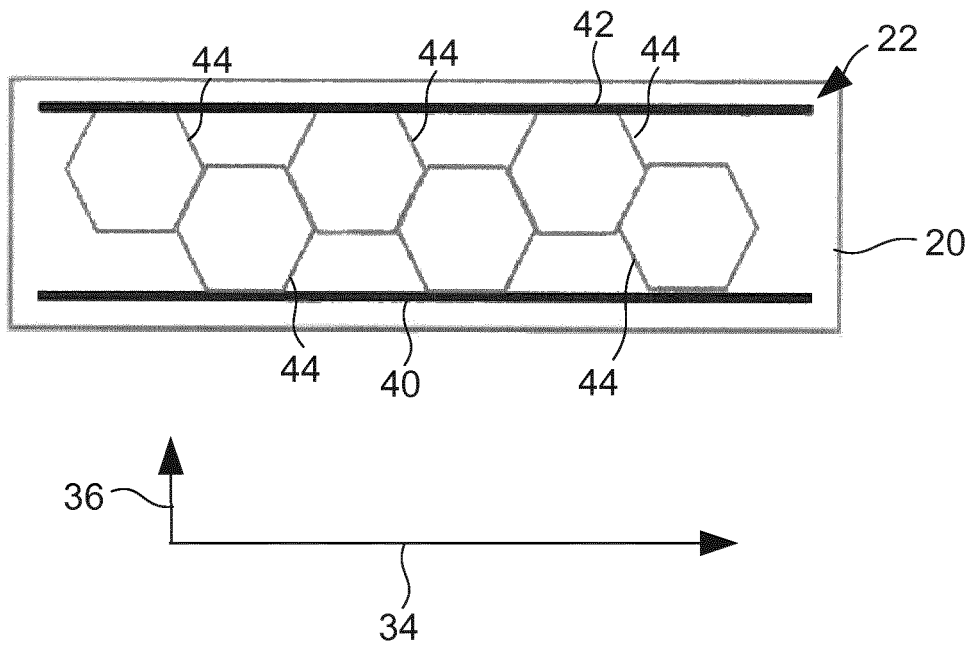
FIG. 8 shows a top view of an exemplary embodiment of a lateral strengthening structure.

FIG. 8 shows a top view of an exemplary embodiment of a lateral strengthening structure 22. The lateral strengthening structure 22 may a widely correspond to the lateral strengthening structure 22 as explained above. The lateral support elements 44 are formed such that they form hexagons and/or honeycombs.

Figure 9:
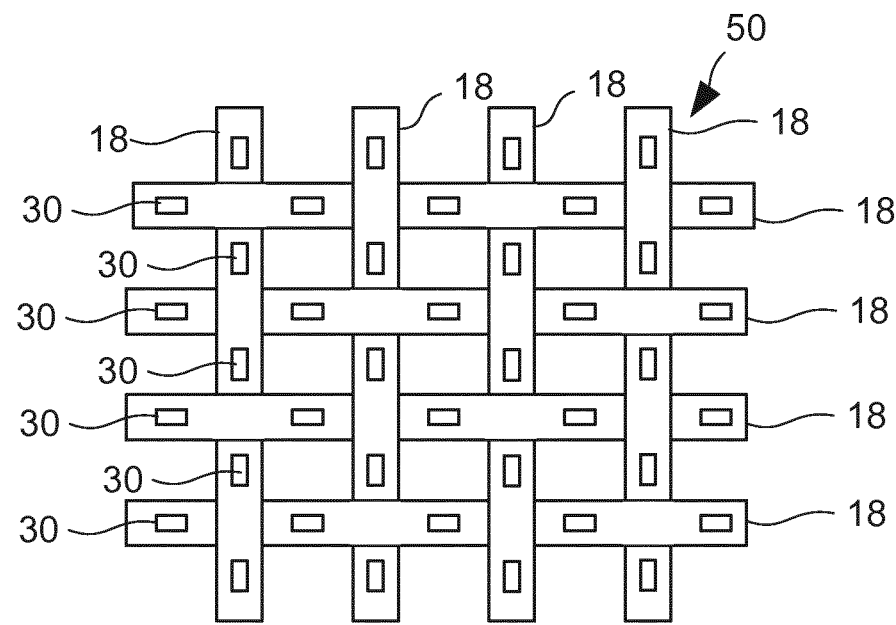
FIG. 9 shows a top view of an exemplary embodiment of a luminous fabric.

FIG. 9 shows a top view of an exemplary embodiment of a luminous fabric 50. The luminous fabric 50 is made of luminous fibers 18, for example luminous fibers 18 as explained above. The light emitting elements 30 are arranged on the luminous fibers 18, wherein for clarity reasons not all light emitting elements 30 are characterized by the corresponding reference sign. The luminous fibers 18 are woven in warp and weft direction.

In an alternative embodiment, the luminous fibers 18 are only woven in warp direction and non-luminous fibers are woven in the weft direction. In this case, the luminous fibers 18 may be the only fibers in warp direction or additional non-luminous fibers may be woven in warp direction.

In an alternative embodiment, the luminous fibers 18 are only woven in weft direction and non-luminous fibers are woven in the warp direction. In this case, the luminous fibers 18 may be the only fibers in weft direction or additional non-luminous fibers may be woven in weft direction.

The luminous fabric 50 may be a textile, for example a clothing, or a part of a textile or clothing. The traces 26, 28 of the luminous fabric 50, e.g. of the luminous fibers 18, may be connected to a driver (not shown in the figures) for driving the light emitting elements 30.

Figure 10:
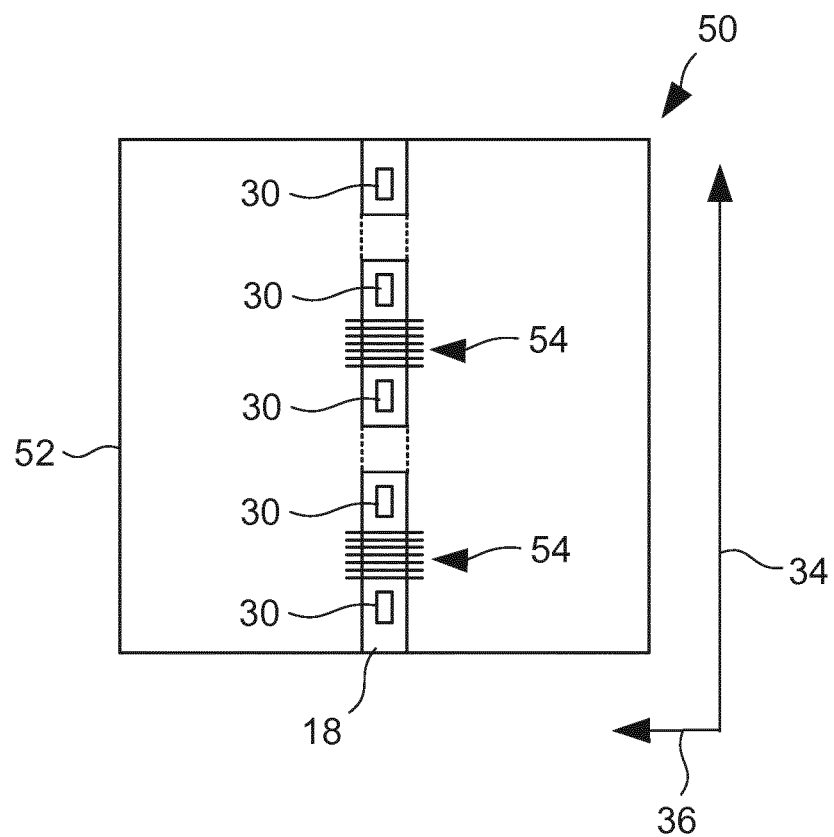
FIG. 10 shows a top view of an exemplary embodiment of a luminous fabric.

FIG. 10 shows a top view of an exemplary embodiment of a luminous fabric 50. The luminous fabric 50 has a base fabric 52 and a luminous fiber 18, for example the luminous fiber 18 as explained above. The base fabric 52 may be a woven fabric and/or woven by non-luminous fibers. The luminous fiber 18 is woven into the base fabric 52 in the length direction 34. The luminous fiber 18 is additionally fixed to the base fabric 52 by yarn 54. The yarn 54 applies a lateral external force on the luminous fiber 18. In the embodiment shown in FIG. 10, only one luminous fiber 18 is woven into the base fabric 52. Of course, multiple luminous fibers 18 may be woven into the base fabric 52, for example in parallel to each other or non-parallel to each other.

The luminous fabric 50 may be a textile, for example a clothing, a seat cover, or a part of a textile, clothing, or seat cover. The traces 26, 28 of the luminous fabric 50, e.g. of the luminous fibers 18, may be connected to a driver (not shown in the figures) for driving the light emitting elements 30.

While the invention has been particularly shown and described with reference to specific embodiments, it should be understood by those skilled in the art that various changes in form and detail may be made therein without departing from the spirit and scope of the appended claims. The scope of the invention is thus indicated by the appended claims and all changes which come within the meaning and range of equivalency of the claims are therefore intended to be embraced.

REFERENCE LIST luminous fiber 18
circuit board 20
strengthening structure 22
isolating material 24
first trace 26
second trace 28
light emitting element 30
mantle 32
length direction 34
lateral direction 36
first frame bar 40
second frame bar 42
support elements 44
luminous fabric 50
base fabric 52
yarn 54

The invention claimed is:
1. A luminous fiber comprising:
a flexible printed circuit board extending in a length direction of the luminous fiber;
at least one electrically conductive trace being formed on the flexible printed circuit board;

at least one light emitting component being arranged on the flexible printed circuit board and being electrically connected to the trace; and a lateral strengthening structure for strengthening the luminous fiber in a lateral direction perpendicular to the length direction; wherein the lateral strengthening structure is electrically isolated from the at least one electrically conductive trace;

wherein the lateral strengthening structure comprises two frame bars formed on the flexible printed circuit board and extending in the length direction of the luminous fiber; and wherein the lateral strengthening structure comprises several lateral support elements formed on the flexible printed circuit board between the frame bars and coupled to the frame bars.

2. A luminous fiber in accordance with claim 1, wherein one of the frame bars is formed along a lateral outer edge of the flexible printed circuit board;

and wherein the other frame bar is formed along another lateral outer edge of the flexible printed circuit board.

3. A luminous fiber in accordance with claim 1; wherein each lateral support element extends from one of the frame bars to the other frame bar.

4. A luminous fiber in accordance with claim 1, wherein the frame bars and the lateral support elements are formed of one piece.

5. A luminous fiber in accordance with claim 1; wherein the lateral support elements comprise perpendicular struts perpendicular to the frame bars;

inclined struts inclined to the frame bars; hexagons, triangles, and/or spring-elements, which have an S-form or a multiple S-form.

6. A luminous fiber in accordance with claim 1; wherein the lateral strengthening structure is at least in part covered by an electrically isolating material.

7. A luminous fiber in accordance with claim 6, further comprising an electrically isolating layer arranged between the lateral strengthening structure and the at least one electrically conductive trace to isolate the at least one electrically conductive trace from the lateral strengthening structure.

8. A luminous fiber in accordance with claim 7, wherein the lateral strengthening structure and the flexible printed circuit board are completely covered by the electrically isolating material.

9. A luminous fiber in accordance with claim 1; wherein the trace and the light emitting elements are arranged on a first side of the flexible printed circuit board and the lateral strengthening structure is arranged on a second side of the flexible printed circuit board, with the second side facing away from the first side.

10. A luminous fiber in accordance with claim 1; wherein at least two separate electrically conductive traces are formed on the flexible printed circuit board; and wherein the light emitting element is electrically connected to both traces.

11. A luminous fiber in accordance with claim 1; wherein the lateral strengthening structure comprises a metal, a polymer, and/or a reinforced polymer.

12. A luminous fiber in accordance with claim 1; comprising a mantle, in which the flexible printed circuit board, the traces, the light emitting element and the lateral strengthening structure are embedded; wherein the mantle is at least in part transparent for the light emitted by the light emitting element.

13. A luminous fabric comprising multiple luminous fibers in accordance with claim 1.

14. A luminous fabric in accordance with claim 13, which is woven by the luminous fibers; wherein the luminous fibers are woven in warp and/or weft direction.

15. A method for producing a luminous fiber, comprising:
providing a flexible printed circuit board extending in a length direction of the fiber;
forming at least one electrically conductive trace on the flexible printed circuit board;
arranging at least one light emitting component on the flexible printed circuit board and electrically connecting the light emitting component to the trace; and
forming a lateral strengthening structure for strengthening the luminous fiber in a lateral direction perpendicular to the length direction by forming two frame bars, which extend in the length direction of the fiber, on the flexible printed circuit board, and forming several lateral support elements on the flexible printed circuit board between the frame bars such that they are coupled to the frame bars; wherein the lateral strengthening structure is electrically isolated from the at least one electrically conductive trace.

* * * * *